US012733448B2

(12) United States Patent
Brugger et al.

(10) Patent No.: US 12,733,448 B2
(45) Date of Patent: Sep. 8, 2026

(54) APPARATUS FOR PROCESSING A WAFER

(71) Applicant: LAM RESEARCH AG, Villach (AT)

(72) Inventors: Michael Brugger, Millstatt (AT); Michael Puggl, Feistritz an der Drau (AT); Christian Putzi, Rosenbach (AT)

(73) Assignee: LAM RESEARCH AG, Villach (AT)

( * ) Notice: Subject to any disclaimer, the term of this patent is extended or adjusted under 35 U.S.C. 154(b) by 973 days.

(21) Appl. No.: 17/802,170

(22) PCT Filed: Feb. 5, 2021

(86) PCT No.: PCT/EP2021/052798
§ 371 (c)(1),
(2) Date: Aug. 25, 2022

(87) PCT Pub. No.: WO2021/170373
PCT Pub. Date: Sep. 2, 2021

(65) Prior Publication Data

US 2023/0360952 A1 Nov. 9, 2023

(30) Foreign Application Priority Data

Feb. 27, 2020 (GB) ...................................... 2002798

(51) Int. Cl.
*H10P 72/76* (2026.01)
*H10P 72/00* (2026.01)

(52) U.S. Cl.
CPC ...... *H10P 72/7606* (2026.01); *H10P 72/0436* (2026.01); *H10P 72/7611* (2026.01); *H10P 72/7616* (2026.01)

(58) Field of Classification Search
CPC ......... H01L 21/68721; H01L 21/68735; H01L 21/68757; H01L 21/6831
See application file for complete search history.

(56) References Cited

U.S. PATENT DOCUMENTS 5,536,244 A 7/1996 Muller et al.
2003/0075107 A1 4/2003 Miyano et al.
2005/0148183 A1* 7/2005 Shiro .................... B24B 37/205 438/692

(Continued)

FOREIGN PATENT DOCUMENTS

CN 108122805 A 6/2018
EP 3566245 A1 11/2019

(Continued)

OTHER PUBLICATIONS

Office Action issued in Corresponding Japanese Patent App No. 2022550131 dated Jun. 23, 2025.

(Continued)

*Primary Examiner* — Lee D Wilson

(57) ABSTRACT

An apparatus for processing a wafer, the apparatus comprising: a rotatable chuck for receiving and rotating a wafer; a heating device arranged to heat a wafer received by the rotatable chuck; a plate that is transparent to radiation emitted by the heating device; and a plate holder that holds an outer periphery of the plate, so as to mount the plate in the plate holder; wherein the plate holder is mountable in the apparatus to position the plate between the heating device and a wafer when the wafer is received by the rotatable chuck.

17 Claims, 5 Drawing Sheets

(56) References Cited

U.S. PATENT DOCUMENTS

| | | | | |
|---|---|---|---|---|
| 2005/0181293 | A1 | 8/2005 | Lee | |
| 2006/0203222 | A1* | 9/2006 | Ohmiya | G03F 7/707 355/75 |
| 2008/0101780 | A1 | 5/2008 | Yokouchi et al. | |
| 2011/0262115 | A1* | 10/2011 | Yokouchi | H01L 21/2686 392/407 |
| 2012/0015523 | A1 | 1/2012 | Leonhard et al. | |
| 2012/0145697 | A1 | 6/2012 | Komatsu et al. | |
| 2012/0186744 | A1 | 7/2012 | Higashijima et al. | |
| 2014/0263271 | A1 | 9/2014 | Sheelavant et al. | |
| 2014/0339215 | A1 | 11/2014 | Plazonic et al. | |
| 2017/0345681 | A1 | 11/2017 | Mui et al. | |
| 2022/0084848 | A1* | 3/2022 | Brien | H01L 21/67115 |
| 2022/0352005 | A1* | 11/2022 | Kleindienst | H01L 21/6715 |
| 2023/0360952 | A1* | 11/2023 | Brugger | H01L 21/67115 |
| 2024/0030050 | A1* | 1/2024 | Goller | H01L 21/67109 |

FOREIGN PATENT DOCUMENTS

| | | | |
|---|---|---|---|
| JP | 2006278846 | A | 10/2006 |
| TW | 201513250 | A | 4/2015 |
| WO | WO-2019103722 | A1 | 5/2019 |

OTHER PUBLICATIONS

Office Action issued in Corresponding Taiwanese Patent App. No. 110105061 mailed Jun. 26, 2024.

International Search Report and Written Opinion of the ISA issued in PCT/EP2021/052798, mailed Apr. 30, 2021; ISA/EP.

GB Search Report of the Intellectual Property Office issued in Application No. GB2002798.3, dated Aug. 5, 2020.

* cited by examiner

APPARATUS FOR PROCESSING A WAFER

CROSS-REFERENCE TO RELATED APPLICATIONS

This application is a U.S. National Phase Application under 35 U.S.C. 371 of International Application No. PCT/EP2021/052798, filed on Feb. 5, 2021, which claims the benefit of Great Britain Patent Application No. GB 2002798.3, filed on Feb. 27, 2020. The entire disclosures of the applications referenced above are incorporated herein by reference.

FIELD OF THE INVENTION

The present invention relates to an apparatus for processing a wafer, the apparatus comprising a rotatable chuck for receiving and rotating the wafer, a heating device arranged to heat a wafer received by the rotatable chuck, and a plate that is transparent to radiation emitted by the heating device.

BACKGROUND OF THE INVENTION

Semiconductor wafers may be subjected to various surface treatment processes, such as etching, cleaning, polishing and material deposition. To perform such processes, a wafer may be mounted on a rotatable chuck, so that various processes can be performed on a surface of the wafer.

For example, the surface of the wafer may be cleaned by applying a cleaning liquid (e.g. isopropyl alcohol or deionised water) to the surface of the wafer. The surface of the wafer may then be dried by spinning the wafer using the rotatable chuck and heating the wafer to cause evaporation of the cleaning liquid. Such a cleaning process is commonly referred to as a spin-clean process.

An example of an apparatus which may be used for cleaning the surface of a wafer is described in US2017/0345681A1, the contents of which are incorporated herein by reference.

The apparatus described in US2017/0345681A1 includes a rotatable chuck on which a wafer is mountable, and a liquid dispenser for dispensing liquid on an upper surface of the wafer when the wafer is mounted on the rotatable chuck. The apparatus also includes an array of heating elements disposed below the wafer when the wafer is mounted in the rotatable chuck, and arranged to heat the wafer. After liquid is dispensed on the surface of the wafer, the array of heating elements are controlled to heat the wafer to cause evaporation of the liquid.

SUMMARY OF THE INVENTION

At its most general, the present invention provides an apparatus for processing a wafer, the apparatus comprising a rotatable chuck for receiving and rotating a wafer, a heating device arranged to heat a wafer received by the rotatable chuck, and a plate that is transparent to radiation emitted by the heating device. The plate is held in a holder which is mountable in the apparatus. In this manner, the plate may be mounted in the apparatus by means of the holder, e.g. by securing the holder in the apparatus. This may greatly facilitate manufacture of the plate, as there may be no need to provide the plate itself with means for mounting it in the apparatus. Instead, means for mounting the plate in the apparatus are provided in the holder.

In contrast, in existing apparatus such as that of US2017/0345681A1, the plate is provided with through holes and notches for mounting the plate in the apparatus (e.g. with a set of screws). Therefore, it is necessary to machine the plate into a complex shape, to provide it with the through holes or notches. The present inventors have realised that this can be particularly difficult where the plate is made of a hard and/or brittle material, such as sapphire. With the apparatus of the invention, as no holes or notches are required in the plate for mounting the plate, the plate may have a simple (e.g. disc-like) shape such that no difficult machining of the plate may be required.

Additionally, providing a holder in which the plate is held may facilitate installing the plate and removing it from the apparatus. The holder may further serve to protect the plate, thus reducing a risk of damage to the plate.

According to a first aspect of the invention, there is provided an apparatus for processing a wafer, the apparatus comprising: a rotatable chuck for receiving and rotating a wafer; a heating device arranged to heat a wafer received by the rotatable chuck; a plate that is transparent to radiation emitted by the heating device; and a plate holder that holds an outer periphery of the plate, so as to mount the plate in the plate holder; wherein the plate holder is mountable in the apparatus to position the plate between the heating device and a wafer when the wafer is received by the rotatable chuck.

Herein, the term "rotatable chuck" (or rotary chuck) may merely mean any wafer holder that is designed to hold a wafer and rotate the wafer.

The rotatable chuck may be configured to rotate the wafer relative to an axis of rotation of the rotatable chuck that is substantially perpendicular to a surface of the wafer when the wafer is received by the rotatable chuck.

The rotatable chuck may be substantially circular when viewed from above.

The rotatable chuck may include a mechanism configured to receive the wafer and hold the wafer securely in place relative to the chuck. Such a mechanism may, for example include any of a holding pin, a clamp, a screw, a vacuum holder, or similar.

The rotatable chuck may be adapted to receive a wafer of a predetermined size, e.g. a wafer having a diameter of 300 mm or 450 mm.

The rotatable chuck may include a motor for driving rotation of the chuck relative to the axis of rotation. Alternatively, the rotatable chuck may be caused to rotate by an external driving means, for example via magnetic induction.

The heating device serves to heat a wafer received by the rotatable chuck. The heating device may include one or more light sources (or light-emitting heating elements) arranged to illuminate a wafer received by the rotatable chuck. Therefore, the heating device may heat the wafer by radiative heating using light.

The heating device may comprise an array of light sources. The term "array" may merely mean a plurality of light sources, and does not necessarily mean that the light sources are arranged in any particular order. The array of light sources may be arranged to face towards the wafer when the wafer is received by the rotatable chuck.

The heating device may have a circular shape when viewed from above.

The heating device may be positioned to heat a bottom surface of the wafer when the wafer is received by the chuck.

The heating device may be located between the chuck and a bottom surface of the wafer when the wafer is received by the chuck.

Herein, a light source (or light-emitting heating element) may refer to a light source which emits light (i.e. electromagnetic radiation) at a wavelength suitable for heating a wafer. For example, a light source may emit light having a maximum intensity in a wavelength range from 380 nm to 650 nm.

In some embodiments, one or more of the light sources may be light emitting diodes (LEDs).

The plate is made of a material that is transparent to light emitted by the heating device. For example, the plate may be made of a material such as glass, sapphire or quartz.

The plate may have a substantially circular shape. For example, the plate may be in the form of a disc of transparent material.

An outer periphery of the plate is held (e.g. secured) in the plate holder. Thus, the plate holder may be disposed around the outer periphery of the plate. In this manner, the plate holder may act as a frame that is disposed around the plate, and in which the plate is held. The plate holder may also be referred to as a frame. Herein, the outer periphery of the plate may refer to a region of the plate at or near an outer edge or perimeter of the plate.

As the plate holder holds the outer periphery of the plate, the rest of the plate may be unobstructed by the plate holder, so that light from the heating device may be effectively transmitted through the plate.

In embodiments where the plate has a circular shape, the plate holder may be in the form of an annular ring disposed around the outer periphery of the plate.

The plate holder may hold the periphery of the plate around the entirety of the circumference of the plate. In other words, the plate holder may contact the entire circumference of the plate.

The plate holder may hold the outer periphery of the plate using any suitable means.

A shape of a portion of the plate holder in which the outer periphery of the plate is held may be complementary to a shape of the outer periphery of the plate.

The plate holder may include a holding mechanism for holding the outer periphery of the plate. For example, the plate holder may be configured to clamp the outer periphery of the plate.

The outer periphery of the plate may be removably held in the plate holder. In such a case, the holding mechanism may be configured to enable the plate to be released from the plate holder. In this manner, the plate may be removed from the plate holder. This may, for example, enable the plate to be replaced, e.g. so that different plates may be used with the same plate holder.

Other means for holding the outer periphery of the plate in the plate holder may also be used, such as an adhesive, or by providing an interference fit between the plate holder and the outer periphery of the plate.

The plate holder may be made of a different material compared to the plate. In this manner, the plate holder may be made of a material which is easier to machine than the material of the plate. This may facilitate providing the plate holder with means for mounting the plate holder in the apparatus. For example, the holder may include plastic and/or metal materials.

The plate holder may be configured to form a seal around the outer periphery of the plate. This may prevent fluid from leaking through the connection between the plate and the plate holder, e.g. to protect the heating device. For example, the plate holder may include a sealing element which is pressed against the outer periphery of the plate to form a seal between the plate holder and the outer periphery of the plate. Suitable sealing elements may include a gasket, such as an O-ring.

The plate holder is configured to be mounted in the apparatus such that the plate is positioned between the heating device and the wafer when the wafer is received by the rotatable chuck. In this manner, the plate may serve to protect the heating device from processes that are performed on the wafer, whilst enabling light from the heating device to be transmitted to the wafer. For example, the plate may serve to prevent the heating device being splashed by liquids that are used to process the wafer.

As discussed above, as the plate holder is configured to be mounted in the apparatus, there may be no need to provide the plate itself with any holes or notches for mounting the plate in the apparatus. Thus, fabrication of the plate may be greatly facilitated.

The plate holder may include any suitable means for mounting the plate holder in the apparatus. For example, the plate holder may include one or more attachment points (or portions) for securing it in the apparatus.

The apparatus may include one or more fasteners which are configured to secure the plate holder in the apparatus.

The apparatus may have a portion which is configured to receive the plate holder, and to which the plate holder may be mounted (e.g. secured).

In some embodiments, the plate holder may be mountable on the rotatable chuck.

The plate holder may be configured to be removably mounted in the apparatus. In this manner, the plate holder and plate may be removed from the apparatus, e.g. in order to replace the plate and/or plate holder.

The plate holder may have a plurality of through holes or openings or notches for mounting the plate holder in the apparatus. In this manner, the plurality of through holes or openings or notches may be used for mounting and securing the plate holder in the apparatus.

The holes or openings or notches in the plate holder may be provided in a periphery of the plate holder.

As mentioned above, the plate holder holds an outer periphery of the plate. Thus, the plate holder may be disposed around the outer periphery of the plate. In particular, the plate holder may have a central opening in which the plate is accommodated in the plate holder. The plurality of through holes or openings or notches in the plate holder for mounting the plate holder in the apparatus are in addition to this central opening.

The plate holder may be fastened to another part of the apparatus by fasteners that pass through the plurality of through holes or openings or notches in the plate holder. In this manner, the plate holder may be securely mounted in the apparatus. Suitable fasteners may, for example, include screws, bolts or similar. In some cases, the part of the apparatus to which the plate holder is fastened may be the rotatable chuck.

The part of the apparatus to which the plate holder is fastened may have a plurality of holes (e.g. tapped holes) which are aligned with the plurality of through holes or openings or notches in the plate holder, and in which the fasteners are engaged.

The plate and plate holder may be parts of a housing that surrounds the heating device. Thus, the plate and plate holder, together with the part of the apparatus to which the plate holder is mounted may form a housing in which the heating device is disposed. The housing may serve to protect the heating device, e.g. from processes performed on the wafer.

The housing may rotate together with the chuck and wafer.

The heating device may not rotate with the chuck and wafer, and instead may be stationary. Therefore, the housing may rotate around the heating device.

Alternatively, the heating device may rotate together with the chuck and wafer (and heating device).

Alternatively, the housing may be mounted to a stationary heating device and thus neither the housing nor the heating device rotate but the chuck may rotate around the heating device surrounded by the non-rotating housing.

The plate and plate holder may be mounted in the apparatus to close the housing around the heating device. Similarly, the plate and plate holder may be removed from the apparatus, in order to access the heating device (e.g. to perform maintenance and/or repairs on the heating device).

The plate holder may be fastened to another part of the housing by fasteners that pass through the plurality of through holes or openings or notches in the plate holder.

The housing may comprise a lower shell positioned below the heating device, and the plate holder may be fastened to an upper surface of the lower shell to surround the heating device. Thus, the plate holder may be mounted on the lower shell, by fastening it to the upper surface of the lower shell.

For example, where the plate holder includes a plurality of through holes or openings or notches, the plate holder may be fastened to the upper surface of the lower shell by fasteners that pass through the plurality of through holes or openings or notches. The fasteners may be engaged in a corresponding plurality of holes (e.g. threaded holes) which are formed in the upper surface of the lower shell.

The lower shell may rotate with the chuck, or may form part of the rotatable chuck.

The apparatus may comprise holding pins for holding the wafer, wherein the holding pins pass through the plurality of through holes or openings or notches in the plate holder. In this manner, the holding pins may pass through the plate holder so that a portion of the holding pins is exposed above the plate holder. As a result, a wafer held in the holding pins may be disposed above the plate.

The holding pins may be rotatable between a holding position in which they are configured to hold a wafer, and a non-holding position in which they are not configured to hold a wafer.

As an example, in embodiments where the plate holder is fastened to the upper surface of the lower shell of the housing, the holding pins may extend from the upper surface of the lower shell and through the plurality of holes.

The plurality of through holes or openings or notches in the plate holder may comprise a first subset of through holes or openings or notches through which fasteners pass to secure the holder plate in the apparatus, and a second subset of through holes or openings or notches through which the holding pins pass.

The holding pins may be configured to exert a gripping force on the wafer, in order to hold the wafer in place.

The plate holder may clamp the outer periphery of the plate. In this manner, the plate may be securely held in place in the plate holder. For example, the plate holder may include a clamp (or clamp mechanism) arranged to clamp the outer periphery of the plate. The clamp may be configured to releasably clamp the outer periphery of the plate. This may enable the plate to be released from the plate holder, e.g. so that the plate may be replaced.

Some or all of an outer edge of the plate may be at an angle other than 90 degrees relative to a front surface of the plate. In this case, the plate holder may clamp the outer periphery of the plate by the plate holder contacting the part of the outer edge of the plate that is at an angle other than 90 degrees relative to the front surface of the plate. For example, the outer edge of the plate may comprise one or more of a straight line angled portion, a curved portion, or an irregular shaped portion. The whole of the outer edge of the plate may be at an angle other than 90 degrees relative to the front surface of the plate.

The outer periphery of the plate may be bevelled or chamfered. In other words, an outer edge (or surface) of the plate may be angled relative to a top surface of the plate. Such a bevelled or chamfered outer periphery of the plate may facilitate locating the plate in the plate holder, as well as retaining the plate in the plate holder. A bevelled or chamfered outer periphery of the plate may also facilitate gripping or clamping the outer periphery of the plate by the plate holder. The outer periphery of the plate being bevelled or chamfered may refer to an outer edge of the plate being bevelled or chamfered.

Alternatively the outer periphery of the plate may have the form of a step.

An angle of a bevelled or chamfered portion of the outer periphery may be between 30 and 80 degrees relative to a top surface of the plate. The inventors have found that such an angle for the bevelled or chamfered portion may facilitate gripping or clamping of the outer periphery of the plate in the plate holder.

The plate holder may comprise an upper part and a lower part for clamping the outer periphery of the plate therebetween; wherein one of the upper part and the lower part has a first clamping surface that has a shape that is complementary to the bevelled or chamfered or stepped outer periphery of the plate; and the first clamping surface contacts the bevelled or chamfered or stepped outer periphery of the plate.

In this manner, the outer periphery of the plate may be clamped (or gripped) between the upper and lower parts of the plate holder. Providing a first clamping surface that is complementary in shape to the bevelled or chamfered or stepped outer periphery of the plate may serve to ensure that the plate is accurately located within the plate holder, and that it is effectively clamped in the plate holder.

The upper part and the lower part of the plate holder may be mountable or securable together, in order to clamp the plate therebetween.

In some examples, the first clamping surface may be provided on the upper part of the plate holder. In other examples, the first clamping surface may be provided on the lower part of the plate holder.

A groove may be located in the first clamping surface, and a sealing element may be located in the groove and forms a seal against the bevelled, chamfered or stepped periphery of the plate. In this manner, a seal may be formed between the plate and the plate holder. This may prevent fluids from leaking through the connection between the plate holder and the plate. This may, for example, serve to prevent fluids which are used to treat a wafer received by the rotatable chuck from reaching the heating device.

The groove may be formed in the first clamping surface, such that it extends around the outer periphery of the plate. In this manner, a seal may be formed around the outer periphery of the plate. The groove may be arranged such that sealing element is compressed between the first clamping surface and the bevelled or chamfered or stepped outer periphery of the plate, in order to form a seal therebetween.

The groove may be shaped to receive and/or retain the sealing element therein.

The sealing element may include any suitable component for forming a seal between the first clamping surface and the bevelled, chamfered or stepped outer periphery of the plate. For example, the sealing element may include a gasket, such as an O-ring.

Another one of the upper part and lower part may have a second clamping surface that contacts a surface of the plate, and the plate may be clamped between the first clamping surface and the second clamping surface. So, for example, where the first clamping surface is provided on the upper part of the plate holder, the second clamping surface may be provided on the lower part of the plate holder (or vice versa). Where the second clamping surface is provided on the lower part, the second clamping surface may contact a lower surface of the plate.

The second clamping surface may be arranged to contact an upper surface or a lower surface of the plate. Where the second clamping surface is provided on the lower part, the second clamping surface may contact a lower surface of the plate. Where the second clamping surface is provided on the upper part, the second clamping surface may contact an upper surface of the plate.

In some embodiments, the lower part of the plate holder may be made of metal; and/or the upper part of the plate holder may be made of plastic.

The lower part of the plate holder may be closer than the upper part to the heating device. In some cases, the lower part may be exposed to radiation emitted by the heating device. Making the lower part of the plate holder out of metal may serve to ensure that the lower part of the plate holder is not damaged by radiation from the heating device.

Suitable metal materials for the lower part of the plate holder include, for example, aluminium, an alloy containing aluminium, or titanium. However, other metals may also be used.

Making the upper part of the plate holder out of plastic may facilitate manufacture of the upper part, e.g. as moulding or 3D printing processes may be used. This may also serve to reduce an overall cost of the plate holder.

Suitable plastic materials for the upper part of the plate holder include, for example, fluoropolymers such as polychlorotrifluoroethylene (PCTFE).

Fluorinated polymers (fluoropolymers) are particularly useful as they are resistant to acids that may be used to process wafers, such as hydrofluoric acid and acid mixtures containing hydrofluoric acid. Such acids are widely used when treating semiconductor wafers.

The upper and lower parts of the plate holder may be fastened together using fasteners to clamp the bevelled or chamfered or stepped outer periphery of the plate therebetween.

Fasteners that may be used for fastening the upper and lower parts of the plate holder together may include screws, bolts or similar. Thus, the upper and/or lower parts may include a plurality of holes for receiving the screws or bolts. However, other types of fasteners may also be used for fastening the upper and lower parts of the plate holder together, for example snapping the lower part into the upper part, or the upper part into the lower part, thereby avoiding the need for additional fasteners.

A surface of the lower part of the plate holder on which radiation emitted by the heating device is incident is reflective. This may minimise heating of the lower part of the plate holder caused by the radiation from the heating device.

For example, where the lower part is made out of metal, the metal may reflect the radiation from the heating device. The surface of the lower part may be smooth or polished, to improve its reflectivity.

In some cases, the lower part may include a reflective surface coating, to reflect radiation emitted by the heating device. For example, a reflective foil may be applied to the surface of the lower part.

In some embodiments, a surface of the plate is coated with an antireflective coating. This may serve to improve transmittance of light through the plate. In this manner, radiation from the heating device may be transmitted more efficiently to a wafer received by the rotatable chuck, to improve an efficiency with which the wafer is heated.

The surface of the plate that is coated with an antireflective coating may face towards the heating device, e.g. towards a light source of the heating device. This may serve to ensure efficient transmission of radiation from the heating device through the plate.

The inventors have found that an antireflective coating may be particularly beneficial where the plate is made of sapphire, as this may significantly improve transmittance of the sapphire plate. For instance, the inventors have found that transmittance may be increased from about 86% for an uncoated sapphire plate to about 92% for a sapphire plate that has an antireflective coating.

According to a second aspect of the invention, there is provided a plate for use in an apparatus for processing a wafer, wherein the plate is transparent to one or more wavelengths of light, and wherein the plate has a bevelled or chamfered or stepped outer periphery.

The plate of the second aspect of the invention may, for example, be used in the apparatus of the first aspect of the invention. Thus, any features discussed in relation to the second aspect of the invention may be included in the first aspect of the invention. Similarly, any features discussed above in relation to the plate of the apparatus of the first aspect of the invention may be applied to the plate of the second aspect of the invention.

Providing the plate with a bevelled or chamfered or stepped outer periphery may facilitate gripping or clamping the outer periphery of the plate. This may, for example, facilitate mounting the plate in a plate holder of an apparatus for processing a wafer. The bevelled or chamfered or stepped outer periphery of the plate may also serve to accurately locate the plate within the plate holder.

The plate holder is transparent to one or more wavelengths. In this manner, it may serve to transmit light at the one or more wavelengths.

Where the plate is used in an apparatus for processing a wafer, the plate may be transparent to radiation emitted by a heating device of the apparatus.

An angle of a bevelled or chamfered portion of the outer periphery may be between 30 and 80 degrees relative to a top surface of the plate.

The plate may be transparent to light having a maximum intensity in a wavelength range from 380 nm to 650 nm. Light having a maximum intensity in this wavelength range may be particularly suited to heating a wafer.

The plate may be transparent to blue light.

The plate may have a diameter of less than the diameter of the wafer to be treated (i.e. if the wafer to be treated has a diameter of 300 mm the plate has a diameter of less than 300 mm). The diameter of the plate may have a diameter in the range of 95% to 99.5% of the diameter of the wafer to be treated.

The plate may comprise sapphire. For example, the plate may be a sapphire plate. The sapphire plate may be made of a synthetic sapphire, e.g. sapphire glass.

Advantageously, a plate comprising (e.g. made of) sapphire may be highly resistant to scratching and etching. In this manner, the plate may be resistant to aggressive processes that are performed on the wafer, such that its transparency is not significantly affected by processes performed on the wafer. As a result, the plate may continue to efficiently transmit light from the heating device to the wafer, in spite of aggressive processes that may be performed on the wafer. In particular, the inventors have found that a sapphire plate is not noticeably etched or damaged by hydrogen fluoride acid, such that transparency of the sapphire plate may not be affected by contact with hydrogen fluoride acid. Thus, the plate comprising sapphire may enable effective processing of a wafer via aggressive etching techniques (e.g. using hydrogen fluoride acid), without impairing the plate's ability to transmit light at the one or more wavelengths. In contrast, the inventors have found that plates made of other materials (e.g. glass or quartz) may be etched by some chemicals such as hydrogen fluoride acid, such that their transparency may be significantly reduced after performing etching process on the wafers using one of these chemicals for a longer time period.

However, as noted above in relation to the first aspect of the invention, when the plate comprises sapphire, it may be difficult to machine the plate to provide it with holes or notches for mounting it in the apparatus. By providing the plate with a bevelled or chamfered or stepped outer periphery, the plate may be securely mounted in a holder, the holder itself being mountable in the apparatus (e.g. via a plurality of through holes in the holder). Thus, the plate of the invention enables aggressive treatments to be performed on the wafer, whilst facilitating manufacture of the plate, as well as mounting of the plate in an apparatus for processing a wafer.

A surface of the plate may be coated with an antireflective coating.

According to a third aspect of the invention, there is provided a plate holder for use in an apparatus for processing a wafer, wherein the plate holder is configured to hold an outer periphery of a plate, so as to mount the plate in the plate holder, and wherein the plate holder is configured to be mounted in the apparatus.

The plate holder of the third aspect of the invention may, for example, be used in the apparatus of the first aspect of the invention. Thus, any features discussed in relation to the third aspect of the invention may be included in the first aspect of the invention. Similarly, any features discussed above in relation to the plate holder of the apparatus of the first aspect of the invention may be applied to the plate holder of the third aspect of the invention.

The plate holder of the third aspect of the invention may, for example, be adapted to hold the plate of the second aspect of the invention.

The plate holder of the third aspect of the invention may provide a convenient means for mounting a transparent plate in an apparatus for processing a wafer. Moreover, as the plate holder is configured to be mounted in the apparatus, the plate itself may not need to be provided with any features (e.g. through holes or notches) for mounting the plate in the apparatus. Thus, construction of the plate may be simplified.

The plate holder may comprise a plurality of through holes or openings or notches for mounting the plate holder in the apparatus.

The plate holder may comprise upper and lower parts for clamping the outer periphery of the plate therebetween.

One of the upper part and the lower part may have a first clamping surface that is configured to contact a bevelled or chamfered or stepped outer periphery of the plate. For example, the upper part of the lower part may have a first clamping surface that is angled to contact a bevelled or chamfered outer periphery of the plate.

The first clamping surface may have an angle of between 30 and 80 degrees. The angle of the first clamping surface may be defined relative to a plane in which the plate holder is arranged to hold the plate. For example, where the plate holder is configured to hold the plate horizontally, the first clamping surface may have an angle of between 30 and 80 degrees relative to a horizontal direction.

A groove may be located in the first clamping surface for receiving a sealing element.

The other of the upper part and the lower part may have a second clamping surface for contacting a lower surface of the plate.

The lower part of the plate holder may be made of metal; and/or the upper part of the plate holder may be made of plastic.

The upper and lower parts of the plate holder may be fastened together using fasteners.

A surface of the lower part may be reflective.

BRIEF DESCRIPTION OF THE DRAWINGS

Embodiments of the present invention will now be discussed, by way of example only, with reference to the accompanying Figures, in which.

DETAILED DESCRIPTION OF THE PREFERRED EMBODIMENTS AND FURTHER OPTIONAL FEATURES OF THE INVENTION

Figure 1A:
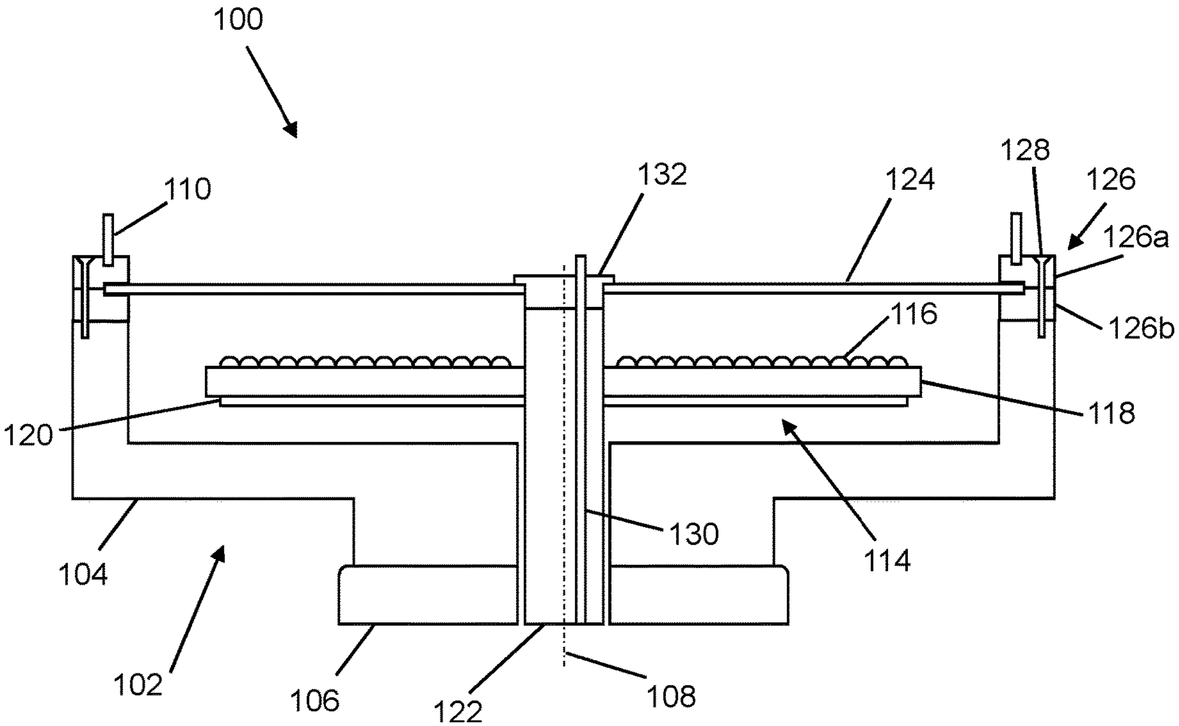
FIG. 1*a* is a schematic cross-sectional view of an apparatus according to an embodiment of the invention.
Figure 1B:
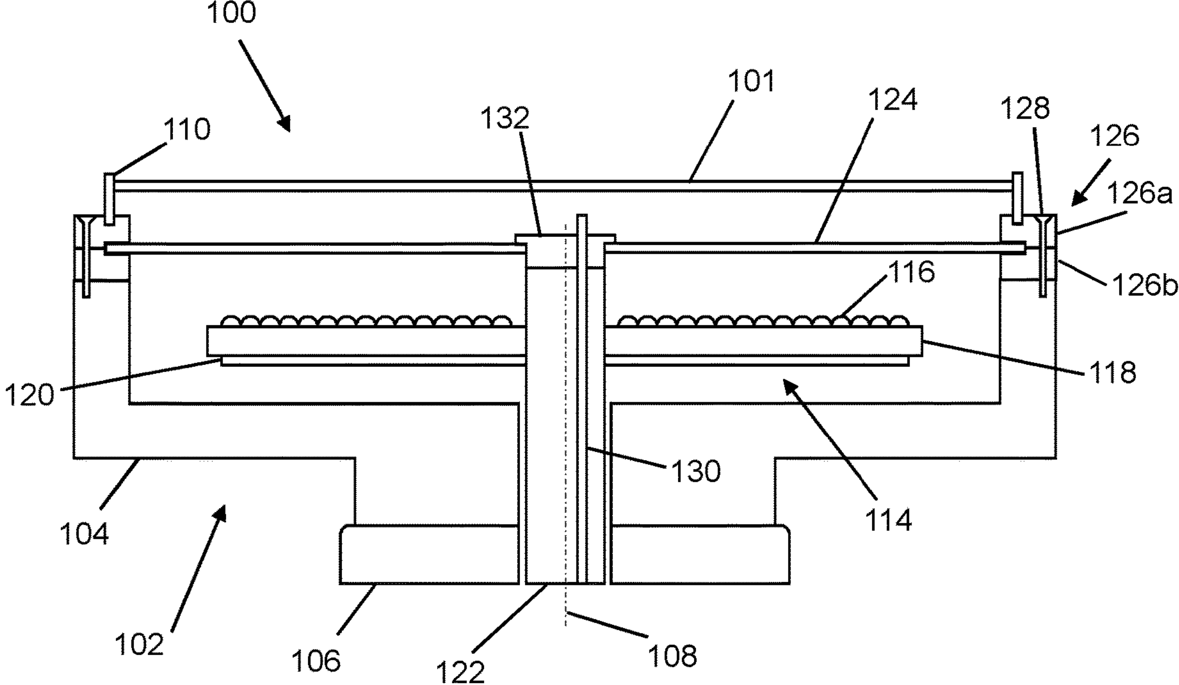
FIG. 1*b* is a schematic cross-sectional view of the apparatus of FIG. 1*a*, where a wafer is mounted in the apparatus.

FIGS. 1*a* and 1*b* show schematic cross-sectional diagrams of an apparatus 100 for processing a wafer according to an embodiment of the invention. In FIG. 1*a*, no wafer is mounted in the apparatus. In FIG. 1*b*, a wafer 101 is mounted in the apparatus 100.

The apparatus 100 includes a rotatable chuck 102 which is adapted to receive and rotate a wafer. The rotatable chuck 102 includes a chuck body 104 which is rotatably mounted on a base 106. The chuck body 104 is rotatable relative to the base 106 about an axis of rotation indicated by reference numeral 108. Rotation of the chuck body 104 relative to the base 106 may be driven, for example, by a motor (not shown), which may itself be controlled by a controller.

The apparatus 100 further comprises a heating device 114. The heating device 114 comprises an array of LEDs 116 arranged to illuminate a wafer mounted in the rotatable chuck 102. The LEDs 114 serve as light sources (or light-emitting heating elements) for heating a wafer (e.g. wafer 101) received by the rotatable chuck 102. In this example, the LEDs are arranged to emit light in a wavelength range from 380 nm to 650 nm. For example, the LEDs 116 may emit light having a maximum intensity in the wavelength range from 380 nm to 650 nm. The inventors have found that this wavelength range is suitable for heating a semiconductor wafer. However, in other examples, the LEDs may be arranged to emit blue light.

The heating device 114 further comprises a support plate 118. The array of LEDs 116 is mounted on an upper surface of the support plate 118, which acts as a heat-sink for the array of LEDs 116 to dissipate heat generated by the LEDs 116. For example, the support plate 118 may be made of a metal such as aluminium. A circuit board 120 including driving circuitry (not shown) for the LEDs 116 is provided on a lower surface of the support plate 118. Interconnections between the array of LEDs 116 and the driving circuitry on the circuit board are made through the support plate 118. The support plate 118 is mounted on a stationary post 122. The stationary post 122 is not connected to the chuck body 104 such that it does not rotate with the chuck body 104. Therefore, the heating device 114 does not rotate with the chuck body 104 in this embodiment, and is instead stationary.

The apparatus 100 further includes a plate 124 which is mounted in the apparatus 100 via a plate holder 126. The plate 124 is substantially transparent to wavelengths emitted by the LEDs 116, e.g. such that all or a majority of light emitted by the LEDs 116 is transmitted by the plate 124. For example, plate 124 may be made of a material such as glass, quartz or sapphire. The plate 124 may have a substantially circular shape, e.g. the plate 124 may be in the form of a disc of transparent material.

The plate holder 126 holds an outer periphery of the plate 124. In particular, the plate holder 126 includes an upper part 126*a* and a lower part 126*b* between which the outer periphery of the plate 124 is clamped. Of course, in other embodiments, the plate holder 126 may have a different configuration, and be arranged to hold the outer periphery of the plate 124 in a different manner.

The plate holder 126 may be in the form of an annular ring, such that it extends around the entire outer periphery (e.g. circumference) of the plate. In this manner, the plate 124 may be surrounded by the plate holder 126, so that the plate 124 is held by the plate holder 126 around its entire periphery.

The plate holder 126 is mounted to an upper surface of the chuck body 104, and secured to the upper surface of the chuck body 104 via a set of fasteners 128. The plate holder 126 includes a plurality of through holes or openings or notches, through which the fasteners 128 pass, in order to secure the plate holder 126 to the chuck body 104. For example, the fasteners 128 may include screws which pass through the through holes or openings or notches in the plate holder 126 and are engaged in corresponding tapped holes in the upper surface of the chuck body 104. Of course, other types of fasteners or means for securing the plate holder 126 to the chuck body 104 may be used.

The plurality of through holes or openings or notches is in addition to a central opening of the plate holder that allows light emitted by the heating device to reach the wafer.

In some embodiments, the fasteners 128 may further serve to fasten the upper and lower parts 126*a*, 126*b* of the plate holder 126 together, in order to clamp the plate 124 between the upper and lower parts 126*a*, 126*b*. Additionally or alternatively, a further set of fasteners may be used for fastening the upper and lower parts 126*a*, 126*b* together. Where a further set of fasteners is used for fastening the upper and lower parts 126*a*, 126*b* together, this may facilitate mounting the plate holder 126 to (and removing the plate holder 126 from) the chuck body 104. This is because the upper and lower parts 126*a*, 126*b* may be fastened together to clamp the plate 124 therebetween, prior to mounting the plate holder 126 to the chuck body 104.

A set of holding pins 110 protrude from the plate holder 126. The holding pins are adapted to receive a wafer and hold the wafer securely in place. In this manner, when a wafer is mounted on the rotatable chuck 102 via the holding pins 110, the wafer may be rotated by rotating the chuck body 104 relative to the base 106. In the configuration shown in FIG. 1*b*, the holding pins 110 exert a gripping force to hold the wafer 101 in place. However, other suitable mechanisms may be used for holding the wafer 101 in place instead (e.g. clamp, screws, suction holder, etc.). In some cases, the holding pins 110 may extend from the upper surface of the chuck body 104, such that they pass through corresponding holes or openings or notches in the plate holder 124 to protrude from the plate holder 124.

The plate holder 126 is mounted on the chuck body 104 such that the plate 124 is disposed between the heating device 114 and the wafer 101, when the wafer 101 is received by the rotatable chuck 102. In this manner, light emitted by the LEDs 116 of the heating device 114 may be transmitted through the plate 124 and then impinge on the wafer 101. Thus, the wafer 101 may be heated by the light from the LEDs 116 of the heating device 114. The plate 124 may include an antireflective coating to minimise reflection of light emitted by the LEDs 116, and therefore improve transmittance of the plate 124. The antireflective coating may be disposed on a lower surface of the plate 124, i.e. the surface facing towards the array of LEDs 116.

As the plate 124 is disposed between the wafer 101 and the heating device 114, the plate 124 may serve to protect the heating device from processes that are performed on the wafer 101. The plate 124 is arranged such that it is substantially parallel to the support plate 118 of the heating device 114.

Together, the plate 124, the plate holder 126 and the chuck body 104 may form a housing that substantially surrounds (e.g. encloses) the heating device 114. Thus, the heating device 114 may be protected by the housing. The chuck body 104 may also be referred to as a lower shell of the apparatus 100, e.g. as the chuck body 104 forms a lower part of the housing around the heating device 114.

The plate holder 126 is removable from the chuck body 104, e.g. by removing fasteners 128. In this manner, the plate 124 and plate holder 124 may be easily removed from the apparatus 100. This may, for example, facilitate replacing the plate 124 and/or plate holder 126, as well as performing maintenance on the plate 124 and/or plate holder 126. Additionally, the plate 124 is removable from the plate holder 126, e.g. by unclamping the first and second parts 126*a*, 126*b* from the outer periphery of the plate 124. This may facilitate replacing the plate 124, as well as enable different plates to be used with the same plate holder 126.

In some embodiments, the plate 124 may include a central opening, the central opening being arranged so that it is located above the stationary post 122. Then, a fluid conduit (or tube) 130 may extend through the stationary post 122 and pass through the central opening in the plate 124. In this manner, the fluid conduit 130 may be used to transport fluid (e.g. a gas or liquid) towards a lower surface of the wafer 101 when the wafer is received by the rotatable chuck 102. A sealing cap 132 may be mounted on the stationary post

122 and arranged to seal the central opening in the plate 124. The sealing cap 132 has an aperture through which the fluid conduit 130 passes. In this manner, the sealing cap 132 may prevent fluid from leaking through the central opening in the plate 124 onto the heating device 114. The sealing cap 132 may be configured to enable rotation of the plate 124 around the sealing cap 132, whilst still maintaining an effective seal with the plate 124. The central opening in the plate 124 may be bevelled or chamfered, in order to facilitate forming a seal with the sealing cap 132.

Figure 2:
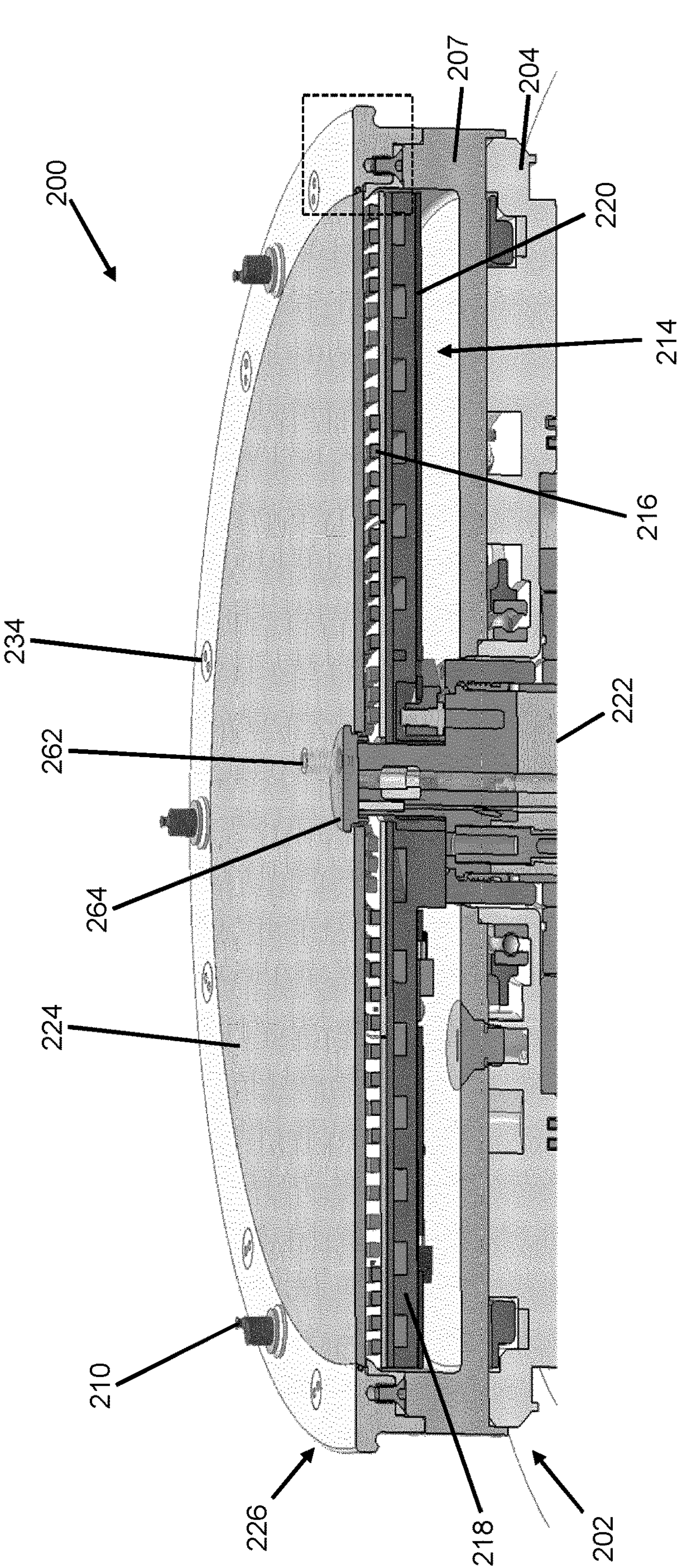
FIG. 2 is a schematic cross-sectional view of an apparatus according to an embodiment of the invention.

FIG. 2 shows a cross-sectional view of an apparatus 200 for processing a wafer according to an embodiment of the invention. The apparatus 200 has a similar construction to the apparatus 100 described above. In particular, the apparatus 200 includes a rotatable chuck 202 which is adapted to receive and rotate a wafer. The rotatable chuck 202 includes a chuck body 204 which is rotatable about a stationary post 222 (e.g. by means of a motor). The apparatus 200 further includes a heating device 214 which is mounted on the stationary post 222, the heating device 214 including an array of LEDs 216 disposed on a support plate 218. The support plate 218 may act as a heat-sink for the LEDs 216. A circuit board 220 including driving circuitry for the array of LEDs 216 is provided on an underside of the support plate 218.

The apparatus 200 further includes a plate 224 which is mounted in the apparatus 200 via a plate holder 226. The plate holder 226 holds an outer periphery of the plate 224, and is mounted to a lower shell 227 that is fixed to the rotatable chuck 202, or directly to the chuck body 204.

The lower shell 227 (or the chuck body 204), plate holder 226 and plate 224 together form a housing that surrounds the heating device 214. The housing rotates together with the rotatable chuck 202 about the heating device 214, which remains stationary.

The plate 224 may be similar to plate 124 described above. In particular, the plate 224 is substantially transparent to wavelengths emitted by the LEDs 216, and it may be made of a material such as glass, quartz or sapphire. The plate 224 has a substantially circular shape, being in the form of a disc of transparent material.

Pins 210 for holding the wafer protrude through the plate holder 226.

Figure 3:
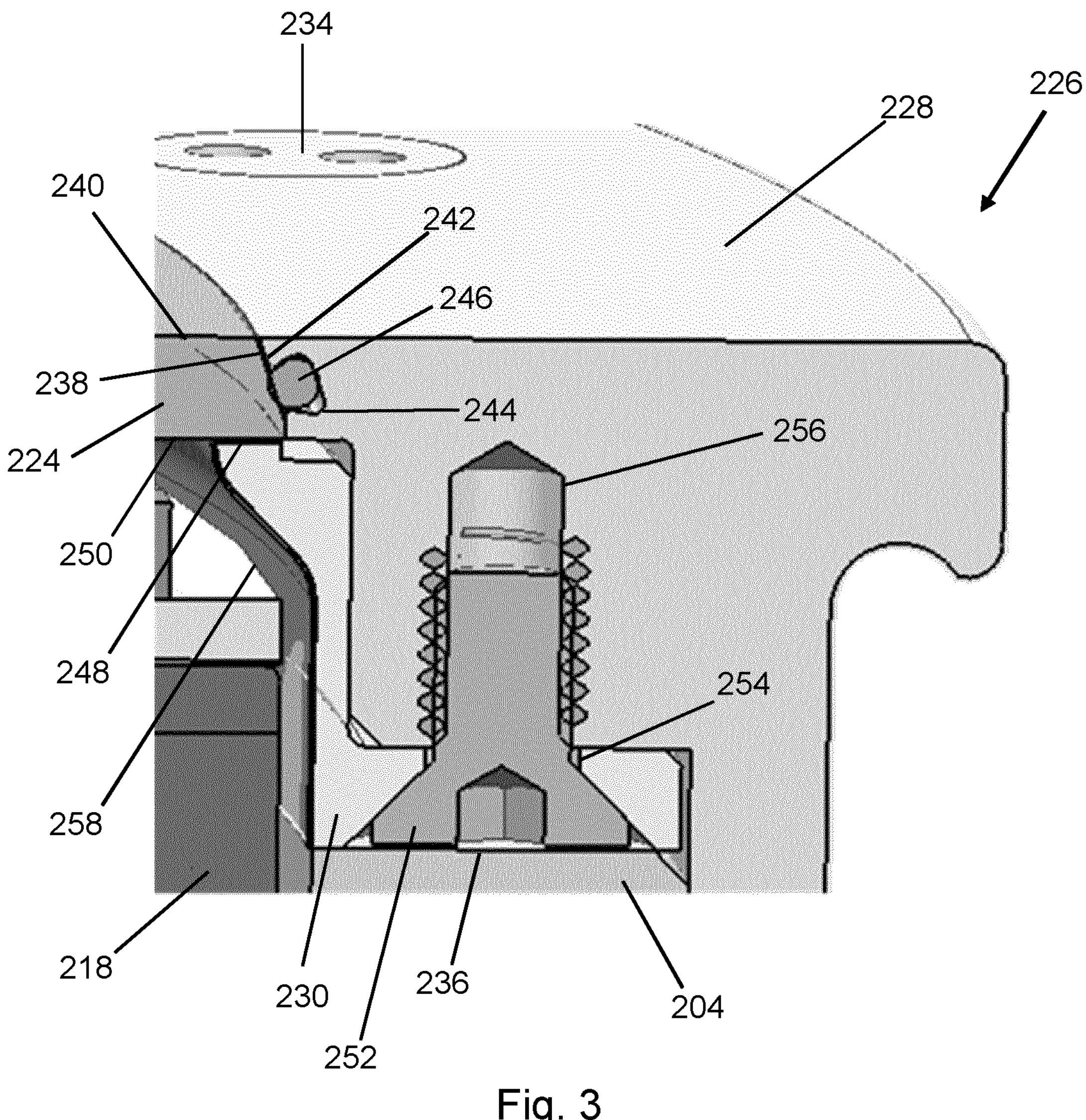
FIG. 3 is an expanded cross-sectional view of a portion of the apparatus of FIG. 2.
Figure 4:
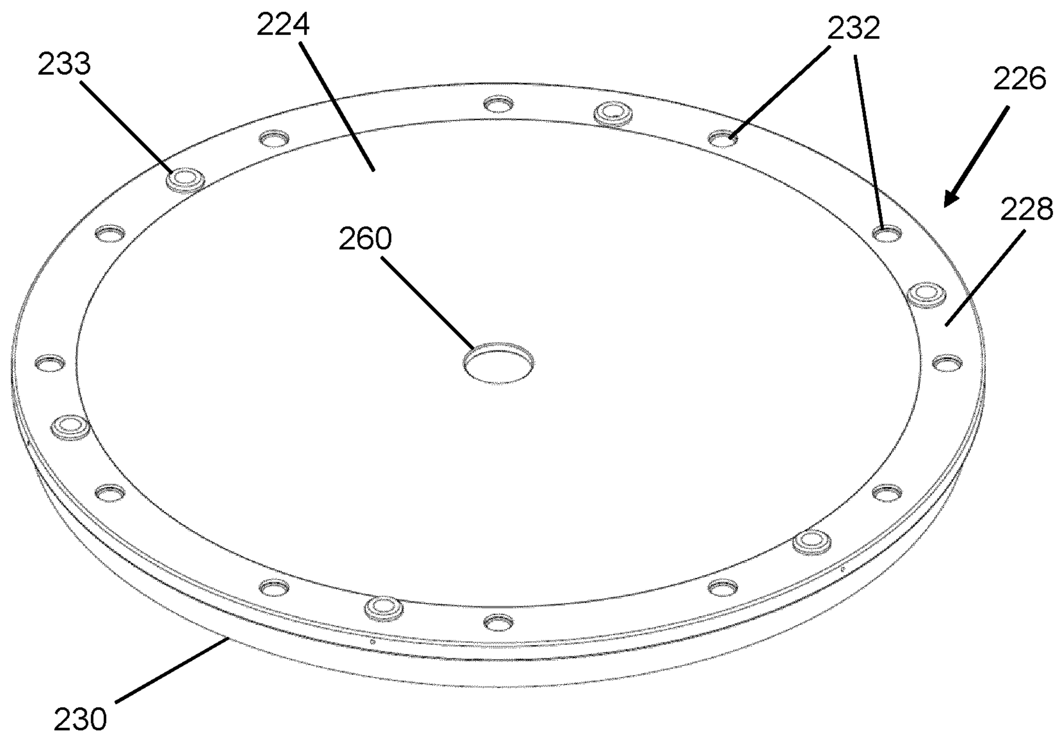
FIG. 4 is a schematic perspective view of a plate holder and plate of the apparatus of FIG. 2.
Figure 5:
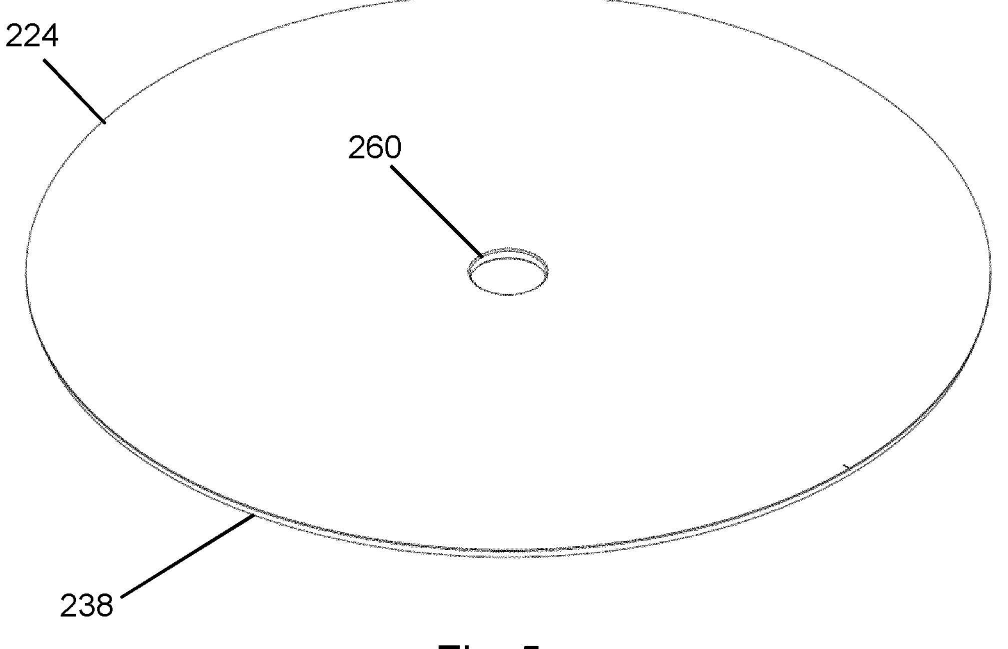
FIG. 5 is a schematic perspective view of the plate of the apparatus of FIG. 2.

FIG. 3 shows an expanded cross-sectional view of the apparatus 200, corresponding to a region indicated by dashed lines in FIG. 2. FIG. 3 illustrates a construction of the plate holder 226 in more detail. FIG. 4 shows a perspective view of the plate holder 226 and the plate 224 (with the rest of apparatus 200 being omitted from FIG. 4, for illustration purposes). FIG. 5 shows a perspective view of the plate 224 on its own.

The plate holder 226 includes an upper part 228 and a lower part 230, between which the outer periphery of the plate 224 is clamped. The plate holder 226 includes a first set of through holes 232 (shown in FIG. 4), through which a set of fasteners 234 pass to fasten the plate holder 226 to an upper surface of the lower shell 227 (or an upper surface of the chuck body 204). The through holes 232 extend through both the upper and lower parts 228, 230 of the plate holder 226, such that the fasteners 234 pass through both the upper and lower parts 228, 230. The fasteners 234 may, for example be screws or bolts. The upper surface 236 of the lower shell 227 (or the upper surface of the chuck body 204) includes a set of holes (e.g. tapped holes) which are aligned with the first set of through holes 232 in the plate holder 226, and in which the fasteners 234 are engaged to fasten the plate holder 226 to the lower shell 227 (or to the chuck body 204).

The plate holder 226 includes a second set of through holes 233 (shown in FIG. 4) arranged around the plate 224. The through holes 233 may extend through both the upper and lower parts 228, 230 of the plate holder 226. A respective holding pin 210 passes through each of the through holes 233, to protrude above the plate holder 226. The holding pins 210 are connected to the chuck body 204, and extend from the chuck body 204 through the through holes 233 in the plate holder 226. The holding pins 210 are arranged to receive a wafer and hold the wafer in place above the plate 224. The holding pins 210 may be configured to exert a gripping force on a wafer, to hold the wafer in place.

The plate holder 226 is mounted on the chuck body 204 such that the plate 224 is disposed between the heating device 214 and a wafer, when the wafer is held in the holding pins 210. In this manner, light emitted by the LEDs 216 of the heating device 214 may be transmitted through the plate 224 and then impinge on the wafer. Thus, the wafer may be heated by the light from the LEDs 216 of the heating device 214. The plate 224 may include an antireflective coating to minimise reflection of light emitted by the LEDs 216, and therefore improve transmittance of the plate 224. The antireflective coating may be disposed on a lower surface 250 of the plate 224, i.e. the surface facing towards the array of LEDs 216.

As shown in FIG. 3, the outer periphery plate 224 is chamfered or bevelled, i.e. an outer edge (or surface) 238 of the plate 224 is angled relative to a top surface 240 of the plate 224. The angle of the outer edge 238 of the plate 224 may be between 30 and 80 degrees relative to the top surface of the plate 224. The upper part 228 of the plate holder 226 includes a first clamping surface 242 which is arranged to contact the outer edge 238 of the plate 224. The first clamping surface 242 has a shape that is complementary to the chamfered or bevelled outer periphery of the plate 224, to provide a close fit between the two parts. For example, the first clamping surface 242 may be at an angle corresponding to that of the outer edge 238 of the plate 224. Additionally, the first clamping surface 242 includes a groove 244 formed therein. The groove 244 holds a sealing element in the form of an O-ring 246, which is pressed against the outer edge 238 of the plate 224 in order to form a seal between the first clamping surface 242 and the outer edge 238 of the plate 224. In this manner, fluids may be prevented from leaking between the plate 224 and the plate holder 226.

Figure 6A:
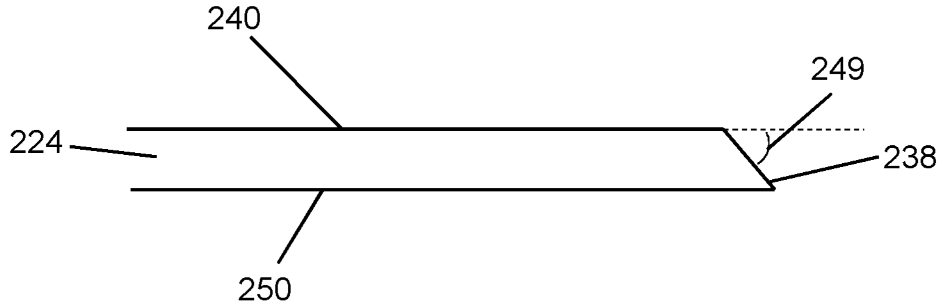
FIG. 6*a* is a schematic cross-sectional view of a portion of the plate of the apparatus of FIG. 2, according to a first example.
Figure 6B:
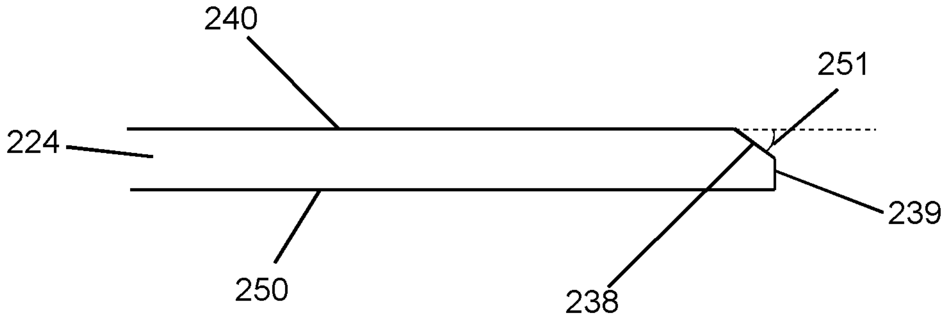
FIG. 6*b* is a schematic cross-sectional view of a portion of the plate of the apparatus of FIG. 2, according to a second example.

FIGS. **6*a* and 6*b* illustrate possible examples of a chamfered or bevelled outer periphery of the plate 224. FIGS. 6*a* and 6*b* show cross-sectional views of a portion of the plate 224 near its outer periphery. In the example of FIG. 6*a*, the outer periphery of the plate is bevelled, with the outer edge 238 extending between the upper surface 240 and the lower surface 250 of the plate 224 at an angle 249 relative to the upper surface 240. The angle 249 may, for example, be between 30 and 80 degrees. In the example of FIG. 6*b*, the outer periphery of the plate is chamfered, with the outer edge 238 extending between the upper surface 240 and a vertical edge surface 239. The outer edge 238 is at an angle 251 relative to the upper surface 240. The angle 251** may, for example, be between 30 and 80 degrees.

The lower part 230 of the plate holder 226 includes a second clamping surface 248 which is arranged to contact the lower surface 250 of the plate 224 at or near its outer periphery. Thus, the outer periphery of the plate 224 is clamped between the first clamping surface 242 and the second clamping surface 248, so that it may be securely held in place therebetween. The upper part 228 and the lower part 230 of the plate holder 226 are fastened together by a set of fasteners 252. In the example shown, each of the fasteners 252 is a screw which passes through a respective hole 254 in the lower part 230 and is engaged in a corresponding tapped hole 256 in the upper part 228. The fasteners 252 may be tightened in order to increase a clamping force exerted by the plate holder 226 on the outer periphery of the plate 224. Conversely, the fasteners 252 may be loosened or undone, in order to release the plate 224 from the plate holder 226.

Together, the plate 224, the plate holder 226 and the lower shell 227 (or chuck body 204) form a housing that substantially surrounds (e.g. encloses) the heating device 214. Thus, the heating device 214 may be protected by the housing.

The upper part 228 of the plate holder 226 is made of a plastic material. Suitable plastic materials for the upper part 228 include, for example, fluoropolymers such as polychlorotrifluoroethylene (PCTFE). The lower part 230 of the plate holder 226 is made of metal. Suitable metal materials for the lower part 230 include, for example, aluminium, an alloy containing aluminium, or titanium.

A surface 258 of the lower part 230 of the plate holder 226 faces inwards towards the heating device 214. As a result, radiation from the heating device 214 may be incident on the surface 258 of the lower part 230. In order to minimise heating of the plate holder 226, the surface 258 of the lower part may be configured to be reflective. For example, a reflective coating may be applied to the surface 258 of the lower part. Such a reflective coating may be achieved, for example, by providing a reflective foil on the surface 258 of the lower part 230.

The plate 224 includes a circular central opening 260 formed therein. The central opening 260 is arranged such that it is disposed above the stationary post 222. A fluid conduit (or tube) 262 extends through the stationary post 222 and passes through the central opening 260 in the plate 224. A sealing cap 264 is mounted on the stationary post 222 and arranged to seal the central opening 260 in the plate 224. The sealing cap 264 has an aperture through which the fluid conduit 262 passes. The central opening 260, fluid conduit 262 and sealing cap 264 may be configured in similar manner to the corresponding features of apparatus 100 described above.

The plate holder 226 described above in relation to FIGS. 2-4 constitutes an embodiment of the invention.

The plate 224 described above in relation to FIGS. **2-6*b*** constitutes an embodiment of the invention.

The invention claimed is:

1. An apparatus for processing a wafer, the apparatus comprising:
- a rotatable chuck for receiving and rotating the wafer;
- a heating device arranged to heat the wafer received by the rotatable chuck;
- a plate that is transparent to radiation emitted by the heating device; and
- a plate holder that holds an outer periphery of the plate, so as to mount the plate in the plate holder, wherein
- the plate holder is mountable in the apparatus to position the plate between the heating device and the wafer when the wafer is received by the rotatable chuck, and
- the outer periphery of the plate is bevelled, chamfered, or stepped.

2. The apparatus according to claim 1, wherein the plate holder has a plurality of through holes or openings for mounting the plate holder in the apparatus.

3. The apparatus according to claim 2, wherein the plate holder is fastened to another part of the apparatus by fasteners that pass through the plurality of through holes or openings in the plate holder.

4. The apparatus according to claim 2, wherein the plate and the plate holder are parts of a housing that surrounds the heating device.

5. The apparatus according to claim 4, wherein the plate holder is fastened to another part of the housing by fasteners that pass through the plurality of through holes or openings in the plate holder.

6. The apparatus according to claim 4, wherein the housing comprises a lower shell positioned below the heating device, and wherein the plate holder is fastened to an upper surface of the lower shell to surround the heating device.

7. The apparatus according to claim 2, wherein the apparatus comprises holding pins for holding the wafer, and wherein the holding pins pass through the plurality of through holes or openings in the plate holder.

8. The apparatus according to claim 1, wherein the plate holder clamps the outer periphery of the plate.

9. The apparatus according to claim 1, wherein some or all of an outer edge of the plate is at an angle other than 90 degrees relative to a front surface of the plate.

10. The apparatus according to claim 1, wherein an angle of a bevelled or chamfered portion of the outer periphery is between 30 and 80 degrees relative to a top surface of the plate.

11. The apparatus according to claim 1, wherein:
- the plate holder comprises upper and lower parts for clamping the outer periphery of the plate therebetween;
- one of the upper part and the lower part has a first clamping surface that has a shape that is complementary to the bevelled, chamfered, or stepped outer periphery of the plate; and
- the first clamping surface contacts the bevelled, chamfered, or stepped outer periphery of the plate.

12. The apparatus according to claim 11, wherein a groove is located in the first clamping surface, and a sealing element is located in the groove and forms a seal against the bevelled, chamfered, or stepped periphery of the plate.

13. The apparatus according to claim 11, wherein another one of the upper part and lower part has a second clamping surface that contacts a surface of the plate, and the plate is clamped between the first clamping surface and the second clamping surface.

14. The apparatus according to claim 11, wherein:
- the lower part of the plate holder is made of metal; and/or
- the upper part of the plate holder is made of plastic.

15. The apparatus according to claim 11, wherein the upper part and lower part of the plate holder are fastened together using fasteners to clamp the bevelled, chamfered, or stepped outer periphery of the plate therebetween.

16. The apparatus according to claim 11, wherein a surface of the lower part on which radiation emitted by the heating device is incident is reflective.

17. The apparatus according to claim 1, wherein a surface of the plate is coated with an antireflective coating.

* * * * *